US007402778B2

(12) United States Patent
Hung et al.

(10) Patent No.: US 7,402,778 B2
(45) Date of Patent: Jul. 22, 2008

(54) OVEN FOR CONTROLLED HEATING OF COMPOUNDS AT VARYING TEMPERATURES

(75) Inventors: Kin Yik Hung, Kwai Chung (CN); Srikanth Narasimalu, Singapore (SG); Wei Ling Chan, Singapore (SG); Man Wai Chan, Kwai Chung (CN); Cheuk Wah Tang, Kwai Chung (CN); Kai Chiu Wu, Kwai Chung (CN)

(73) Assignee: ASM Assembly Automation Ltd., Hong Kong (HK)

( * ) Notice: Subject to any disclaimer, the term of this patent is extended or adjusted under 35 U.S.C. 154(b) by 236 days.

(21) Appl. No.: 11/118,022

(22) Filed: Apr. 29, 2005

(65) Prior Publication Data

US 2006/0249501 A1 Nov. 9, 2006

(51) Int. Cl.

| | |
|---|---|
| ***C23C 16/00*** | (2006.01) |
| ***F27B 5/16*** | (2006.01) |
| ***F27B 5/18*** | (2006.01) |
| ***F27D 3/12*** | (2006.01) |

(52) U.S. Cl. ....................... 219/404; 219/411; 392/418; 118/724; 118/729

(58) Field of Classification Search ....................... None
See application file for complete search history.

(56) References Cited

U.S. PATENT DOCUMENTS

| | | | | |
|---|---|---|---|---|
| 5,367,606 | A * | 11/1994 | Moslehi et al. | 118/724 |
| 5,662,469 | A * | 9/1997 | Okase et al. | 432/6 |
| 5,710,407 | A * | 1/1998 | Moore et al. | 219/405 |
| 5,892,886 | A * | 4/1999 | Sandhu | 392/416 |
| 5,910,218 | A * | 6/1999 | Park et al. | 118/728 |
| 6,300,600 | B1 * | 10/2001 | Ratliff et al. | 219/390 |
| 6,492,621 | B2 * | 12/2002 | Ratliff et al. | 219/390 |
| 6,508,885 | B1 * | 1/2003 | Moslehi et al. | 118/728 |
| 6,610,968 | B1 * | 8/2003 | Shajii et al. | 219/497 |
| 6,998,580 | B2 * | 2/2006 | Kusuda et al. | 219/411 |
| 2004/0060917 | A1 * | 4/2004 | Liu et al. | 219/390 |
| 2005/0022741 | A1 * | 2/2005 | Seo et al. | 118/725 |
| 2006/0180082 | A1 * | 8/2006 | Iwamoto et al. | 118/724 |

FOREIGN PATENT DOCUMENTS

| | | | |
|---|---|---|---|
| GB | 2317497 | A * | 3/1998 |
| JP | 08-236920 | A * | 9/1996 |

* cited by examiner

*Primary Examiner*—Joseph M Pelham
(74) *Attorney, Agent, or Firm*—Ostrolenk, Faber, Gerb & Soffen, LLP

(57) ABSTRACT

An oven is provided for curing or reflowing compounds on objects, such as lead frames or other substrates. The oven comprises a heating chamber, a heating assembly mounted in thermal communication with the heating chamber to provide heat thereto, and a support assembly for supporting the object in the heating chamber for heating. The heating assembly and support assembly are configured to be movable relative to one another for controllably positioning the object at variable distances with respect to the heating assembly. Heating of the object according to a heating profile can thus be achieved by controlled heating of the object at different temperatures by positioning the object at different distances with respect to the heating assembly during the heating process although there is a single heating zone.

15 Claims, 5 Drawing Sheets

OVEN FOR CONTROLLED HEATING OF COMPOUNDS AT VARYING TEMPERATURES

FIELD OF THE INVENTION

The invention relates to a curing oven for heating compounds that are comprised in or located on electronic components. The term "curing oven" shall include reflow ovens, as the curing oven herein is also adaptable for use in reflowing processes.

BACKGROUND AND PRIOR ART

Curing ovens are employed in semiconductor assembly for setting compounds such as epoxy resin and encapsulation molding compound that are introduced onto electronic components. These compounds are usually introduced onto electronic components in fluid form. They may also be suitable for reflowing. Based on the characteristics of these compounds, they may have to be heated according to specific heating profiles during the curing or reflowing process.

In particular, one implementation of curing ovens is in the curing of epoxy or reflowing of solder applied in the field of die bonding. Typically, semiconductor dice are bonded onto substrates such as leadframes using epoxy or solder as an adhesive. Epoxy is first introduced onto the substrate in fluid form at a bonding position, and a die is placed onto the epoxy at the bonding position. The epoxy or solder is then cured or reflowed by heating to solidify the bond.

Epoxy curing or reflowing using ovens is typically carried out according to specified heating profiles, such that the epoxy is exposed to various different temperatures during the curing or reflowing processes. FIG. 7 shows typical heating profiles for epoxy curing and reflowing processes, wherein the epoxy or solder should be controllably heated at varying temperatures. For epoxy curing, the epoxy may be preheated to a curing temperature, heated at the curing temperature for a specified period of time and then allowed to cool. For solder reflow, the solder may be preheated to a flux activation temperature, heated at the flux activation temperature for a specified period of time, then further heated to a reflow temperature whereat the heating temperature is maintained at the reflow temperature for a specified period of time. Thereafter, the solder is allowed to cool. The heating profiles may differ for different types of epoxy or solder.

One common feature of prior art curing ovens is that, if the epoxy or solder compound is to be heated at different temperatures, the curing ovens must have multiple thermal zones. Thus, curing ovens typically consist of multiple thermal zones wherein each zone is maintained at a single temperature. A substrate is heated according to a specified heating profile when it travels through the different thermal zones.

The use of curing ovens requiring multiple thermal zones to conduct such heating has several disadvantages. One disadvantage is that the space occupied by the curing oven is relatively large because of the need to have multiple heating zones. Its construction is also relatively complex, as different temperature zones have to be maintained and the substrate has to be conveyed through all the different temperature zones. Hence the cost of the curing oven is high. For curing oven applications where there is small-scale production and/or space limitations, such prior art curing ovens are not economical or cost-effective.

Moreover, due to the large size of such prior art curing ovens and their construction complexity, sealing of their enclosures is difficult. Thus, where nitrogen or forming gas is required in the oven to maintain a low level of oxygen content and prevent oxidation of the substrate, a large amount of such gas has to be continuously pumped to the curing oven to compensate for the leakage. Furthermore, the interaction among the interfaces of the different thermal zones induces instability on the substrate during the curing process. The final curing result may thereby be adversely affected.

SUMMARY OF THE INVENTION

It is thus an object of the invention to provide a curing oven that is adapted to heat a compound to be processed according to a predetermined heating profile while avoiding the approach of using multiple thermal zones that are found in the above-described conventional curing ovens.

Accordingly, the invention provides an oven for curing or reflowing compounds on objects comprising: a heating chamber; a heating assembly mounted in thermal communication with the heating chamber to provide heat thereto; and a support assembly for supporting the object in the heating chamber for heating; wherein the heating assembly and support assembly are configured to be movable relative to one another for controllably positioning the object at variable distances with respect to the heating assembly, whereby to provide controlled heating of the object at different temperatures at different distances with respect to the heating assembly.

It will be convenient to hereinafter describe the invention in greater detail by reference to the accompanying drawings. The particularity of the drawings and the related description is not to be understood as superseding the generality of the broad identification of the invention as defined by the claims.

BRIEF DESCRIPTION OF THE DRAWINGS

An example of a curing oven in accordance with the invention will now be described with reference to the accompanying drawings, in which.

DETAILED DESCRIPTION OF THE PREFERRED EMBODIMENT

Figure 1:
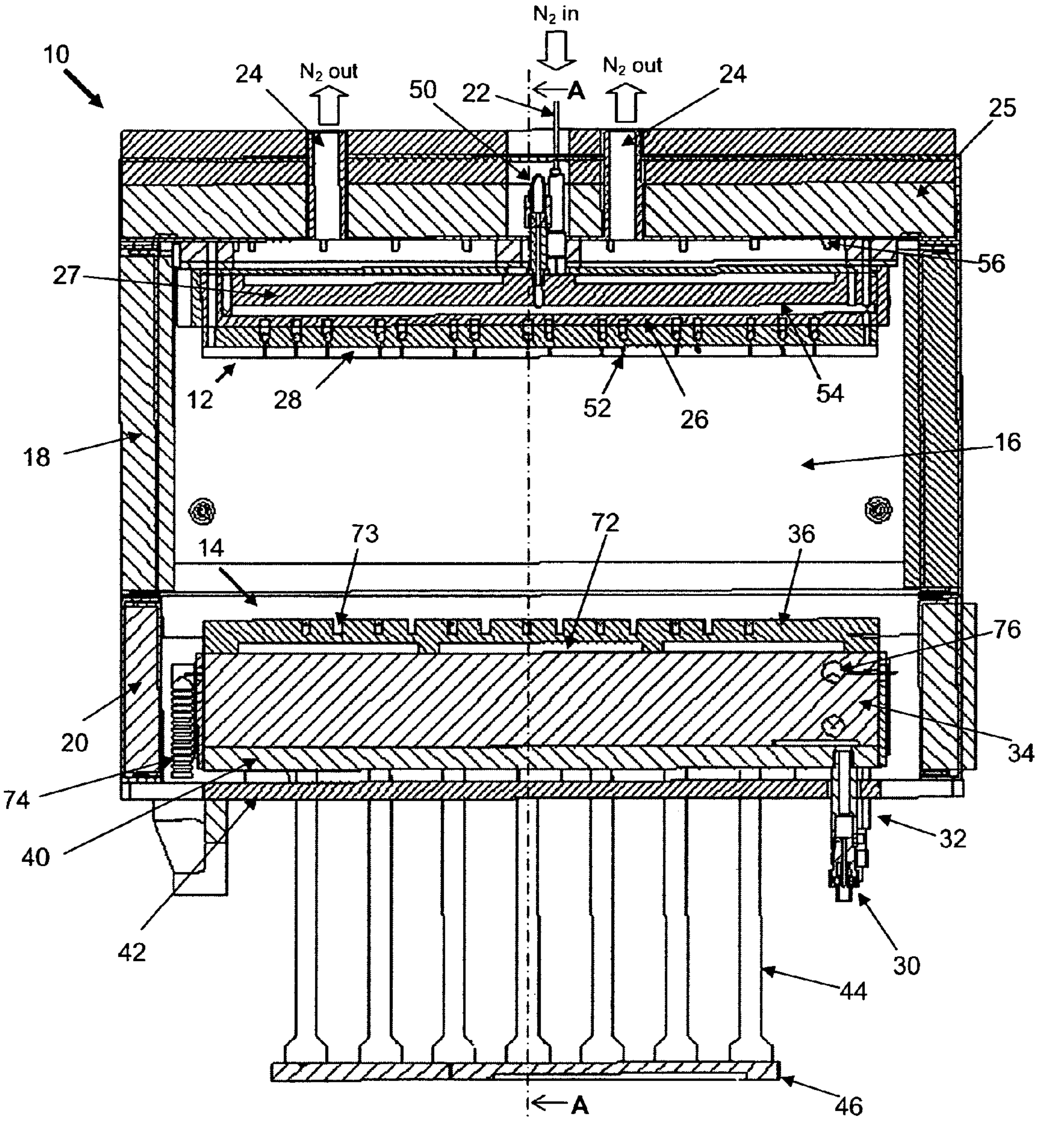
FIG. 1 is a cross-sectional side view of a curing oven according to the preferred embodiment of the invention employing a single-zone concept.

FIG. 1 is a cross-sectional side view of a curing oven 10 according to the preferred embodiment of the invention employing a single-zone concept. The curing oven 10 generally comprises an upper heating assembly 12 and a lower heating assembly 14. The upper and lower heating assemblies 10, 12 are mounted in thermal communication with a heating chamber 16 wherein an object, for example a substrate (not shown) that carries a compound to be cured, is to be heated. Preferably, the upper and lower heating assemblies 12, 14 are mounted to inside surfaces of the heating chamber 16 facing each other and are located above and below the substrate respectively. A region around the upper heating assembly 12 is surrounded by an upper thermal insulation wall 18 and a region around the lower heating assembly 14 is surrounded by a lower thermal insulation wall 20, so that the sides of the heating chamber 16 are substantially enclosed. In the prior art, openings may be necessary for communication with other heating zones so that the heating chamber is not substantially enclosed.

In order to prevent oxidation of the substrate when it is being heated in the heating chamber 16, a relatively inert gas such as nitrogen gas or other forming gas is introduced into the curing oven 10 via a nitrogen gas inlet 22. Used nitrogen gas is allowed to exit the curing oven via an exhaust system, which may be in the form of nitrogen gas exhausts 24 incorporated into a top thermal insulation layer 25 of the curing oven 10. An upper heater block 26 in the upper heating assembly 12 serves to provide heat to the heating chamber 16. A gas discharge outlet such as a nitrogen gas discharge plate 28 mounted to the upper heater block 26 facilitates introduction of nitrogen gas by channeling it from the nitrogen gas inlet 22 into the heating chamber 16.

In the illustrated embodiment, nitrogen gas is introduced to the curing oven 10 via the nitrogen gas inlet 22 and channeled through a nitrogen gas inlet duct 50 before being distributed into nitrogen gas channels 54 formed in the upper heater block 26. The discharge plate 28 mounted to the upper heater block 26 has a plurality of nitrogen discharge holes 52. The nitrogen gas travels from the nitrogen gas channel 54 through the nitrogen discharge holes 52 into the heating chamber 16.

Used nitrogen gas then flows into an exhaust plate 27 through a plurality of exhaust channels 56. From the exhaust plate 27, nitrogen gas exits from the curing oven 10 through nitrogen gas exhaust outlets 24.

Nitrogen gas is also introduced into the curing oven 10 via a nitrogen gas inlet nozzle 30 coupled to the lower heating assembly 14. A cooling plate 36 is mounted onto the lower heater block 34 so that the temperature of the substrate is further controllable by exposing it near to the lower heating assembly 14. Heating means such as a lower heater block 34 in the lower heating assembly 14 provides heat to the cooling plate 36 and heating chamber 16. As will be described in more detail below, the cooling plate 36 includes a plurality of support wire slots 73 for receiving support wires that can be lowered below the top surface of the cooling plate 36.

Also coupled to the lower heating assembly 14 are cooling means, such as a compressed air inlet nozzle 32 that is operable to introduce cooling compressed air to the lower heating assembly 14 in order to lower the temperature of the cooling plate 36 and in the region around the lower heating assembly 14. Compressed air channels 76 incorporated in the lower heater block 34 help to cool the heater block 34 and cooling plate 36 if necessary in order to expeditiously counteract the heating effects from the lower heater block 34. A mounting plate 40 mounts the lower heating assembly 14 to the curing oven 10, and it is further enclosed with a bottom thermal insulation layer 42. Heater wire housings 74 are located at the side of the lower heater block 34 to shield cables and wires used to operate the lower heater block 34.

There is also a substrate support assembly comprising support rods 44 mounted on a support base 46 for supporting the substrate while it is being heated in the heating chamber 16. The substrate support assembly is configured to be movable relative to the upper heating assembly, as well as the lower heating assembly 14, for controllably positioning the object at variable distances with respect to the upper and lower heating assemblies 12, 14. This is to enable heating of the substrate at different temperatures at different distances with respect to the heating assemblies 12, 14.

Figure 2:
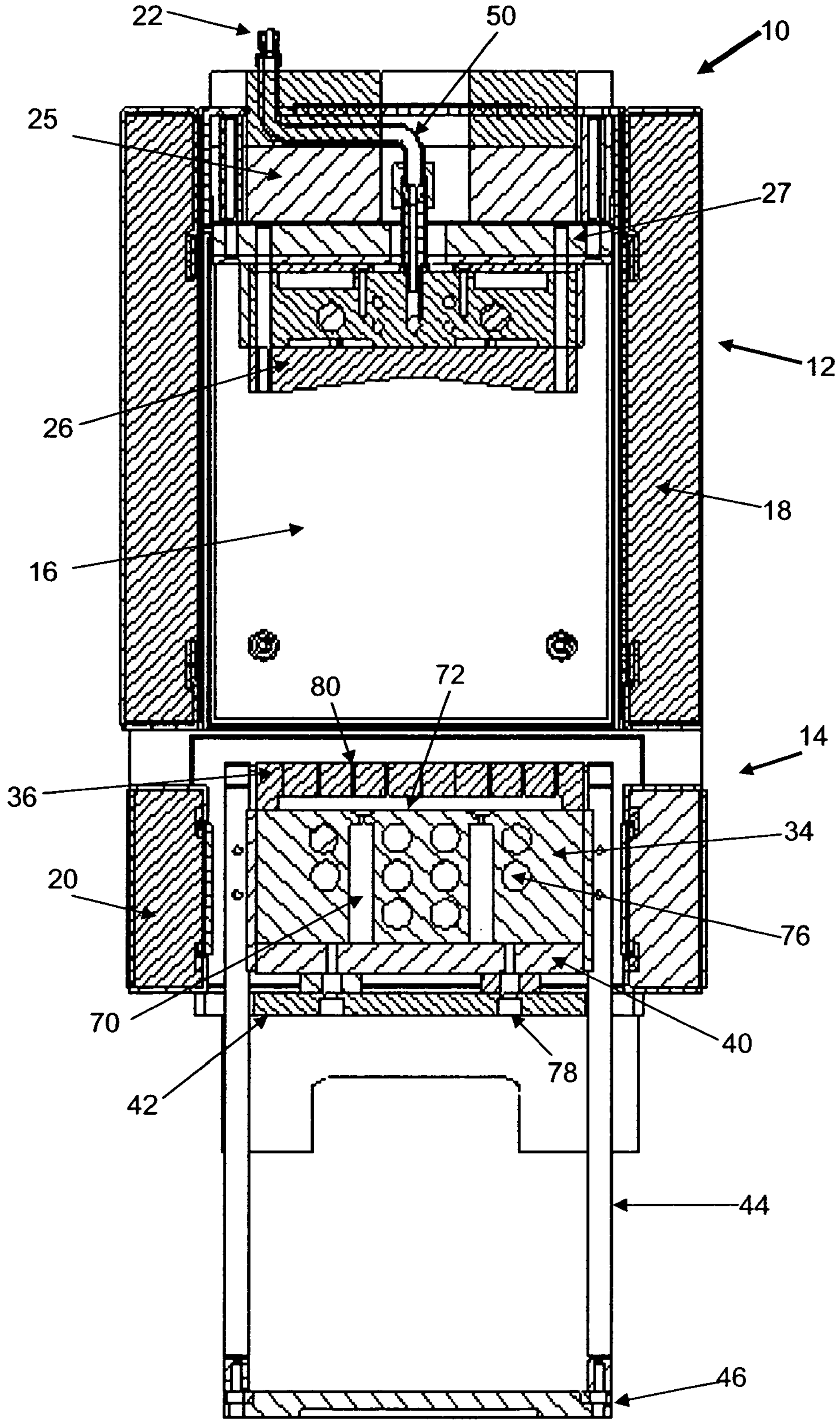
FIG. 2 is a cross-sectional side view of the curing oven of FIG. 1 looking along sectional line A-A of FIG. 1.

FIG. 2 is a cross-sectional side view of the curing oven 10 of FIG. 1 looking along sectional line A-A of FIG. 1. Nitrogen gas is introduced to the lower heating assembly 14 via the nitrogen gas inlet nozzle 30 into a nitrogen gas chamber 70 formed in the lower heater block 34. From the nitrogen gas chamber 70, the nitrogen gas enters a series of nitrogen gas pockets 72 located just below the cooling plate 36. The nitrogen gas is then transmitted from the nitrogen gas pockets 72 to the heating chamber 16 through the cooling plate 36.

Compressed air is introduced into the lower heating assembly 14 via the compressed air nozzle 32, which enters a network of compressed air channels 76 formed in the lower heater block 34. The compressed air can be used to cool the lower heating assembly 14, and counteracts heating by the lower heater block 34. The compressed air channels 76 are preferably distributed throughout the lower heater block 34 for distributing compressed air in the lower heating assembly 14, and may comprise one or more layers of connected channels.

Figure 3:
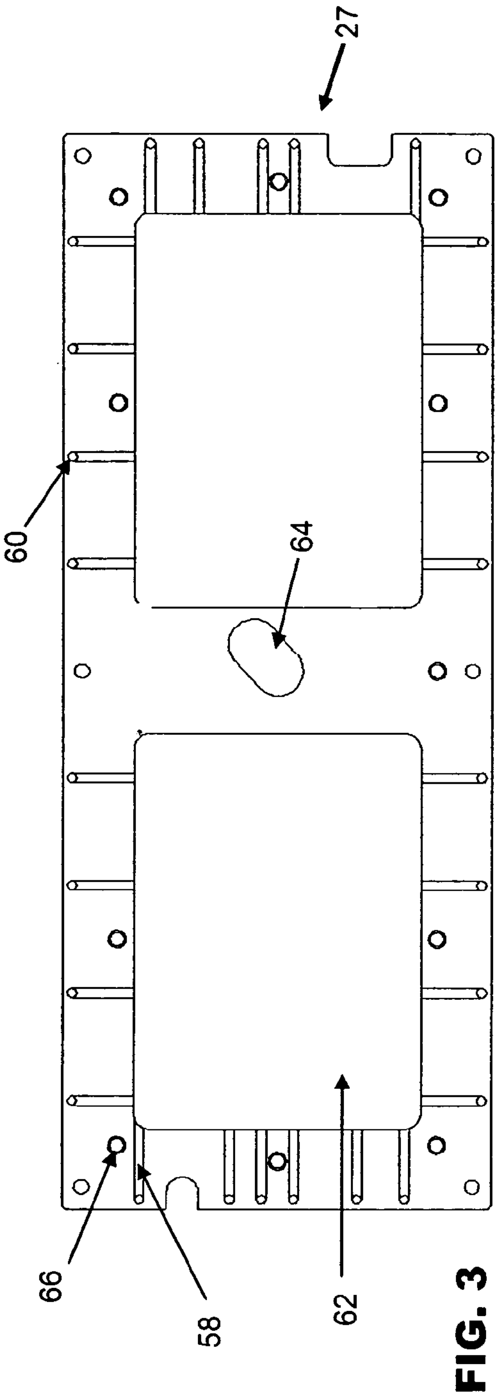
FIG. 3 is a plan view of an exhaust plate that is attachable to the upper heating assembly.

FIG. 3 is a plan view of an exhaust plate 27 that is attachable to the upper heating assembly 12 of FIG. 1. The exhaust plate 27 has a plurality of exhaust channels 58 receiving used nitrogen gas from the heating chamber 16 through exhaust channel inlet holes 60 located at the ends of the exhaust channels 58. Nitrogen gas is led through the exhaust channels 58 into nitrogen gas pockets 62. There is a gas pipe channel 64 for receiving a nitrogen gas inlet duct 50 as well as other tubings and cables supplying the curing oven 10. A series of mounting holes 66 are present for mounting the exhaust plate 27 to the upper heating assembly 12.

Figure 4:
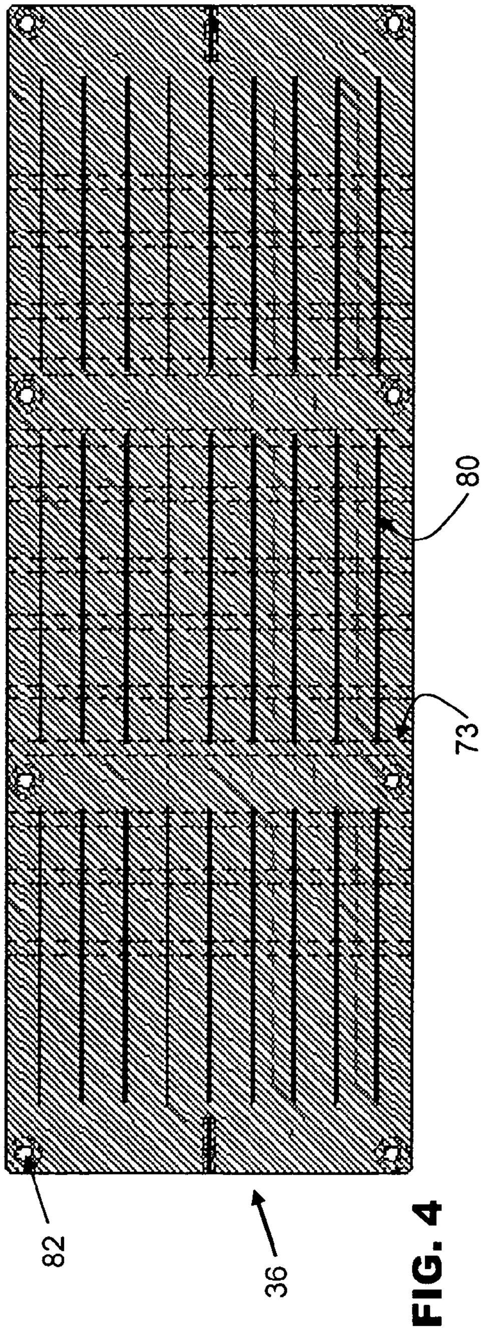
FIG. 4 is a plan view of a cooling plate of the lower heating assembly.

FIG. 4 is a plan view of a cooling plate 36 of the lower heating assembly 14. The cooling plate 36 has a series of parallel lines of support wire slots 73 laid out over the length of the cooling plate 36. The positions of these support wire slots 73 correspond to the positions of support wires comprised in the substrate support assembly. This allows the support wires to be retracted below the top surface of the cooling plate 36 when it is necessary for the substrate to be in contact with the cooling plate 36. A series of parallel nitrogen gas discharge slits 80 are preferably set perpendicularly to the support wire slots 73. These nitrogen gas discharge slits 80 are in communication with the nitrogen gas pockets 72 located under the cooling plate 36 for nitrogen gas to flow therefrom into the heating chamber 16. A number of mounting screw holes 82 are present for mounting the cooling plate to the lower heating assembly 14.

Figure 5:
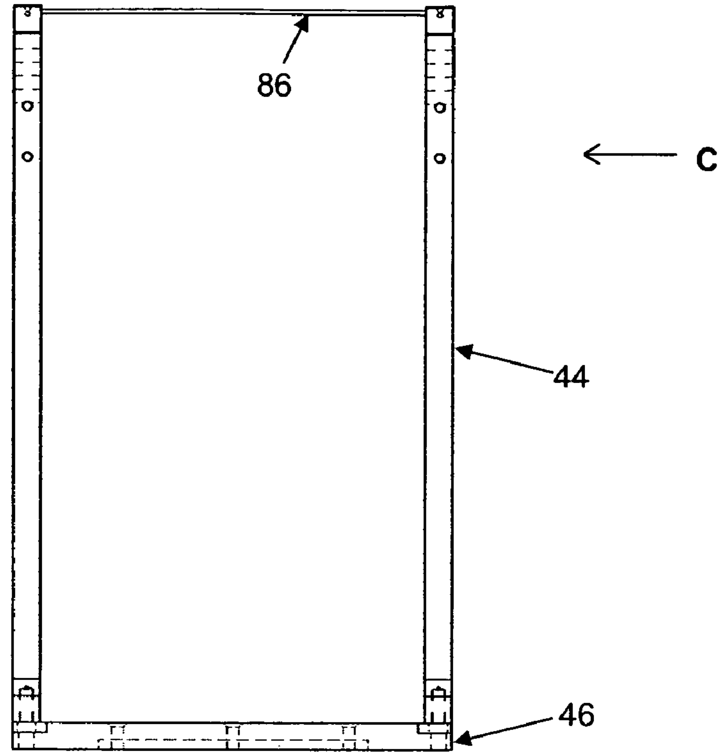
FIG. 5 is a side view of a substrate support assembly that is adapted for coupling to the lower heating assembly.

FIG. 5 is a side view of a substrate support assembly that is adapted for coupling to the lower heating assembly 14. The substrate support assembly comprises support rods 44 mounted onto a support base 46. A support platform is carried by the support rods 44, and may be in the form of a plurality of support wires 86, each of which is mounted to a pair of support rods 44. The support base 46 is drivable to move up and down together with the support rods 44 relative to the lower heating assembly 14 so that the substrate supported by the support rods 44 experience corresponding movement. A substrate supported on the support wires 86 is moved towards or away from the upper heating assembly 12 during heating of the substrate according to a heating profile. Preferably, the support wires 86 are located inside the heating chamber 16 and the support base 46 is located outside the heating chamber 16. The support rods 44 extend from the support base 46 into the heating chamber 16 through an enclosure of the heating chamber 16, such as the bottom thermal insulation layer 42 shown in FIG. 1.

Figure 6:
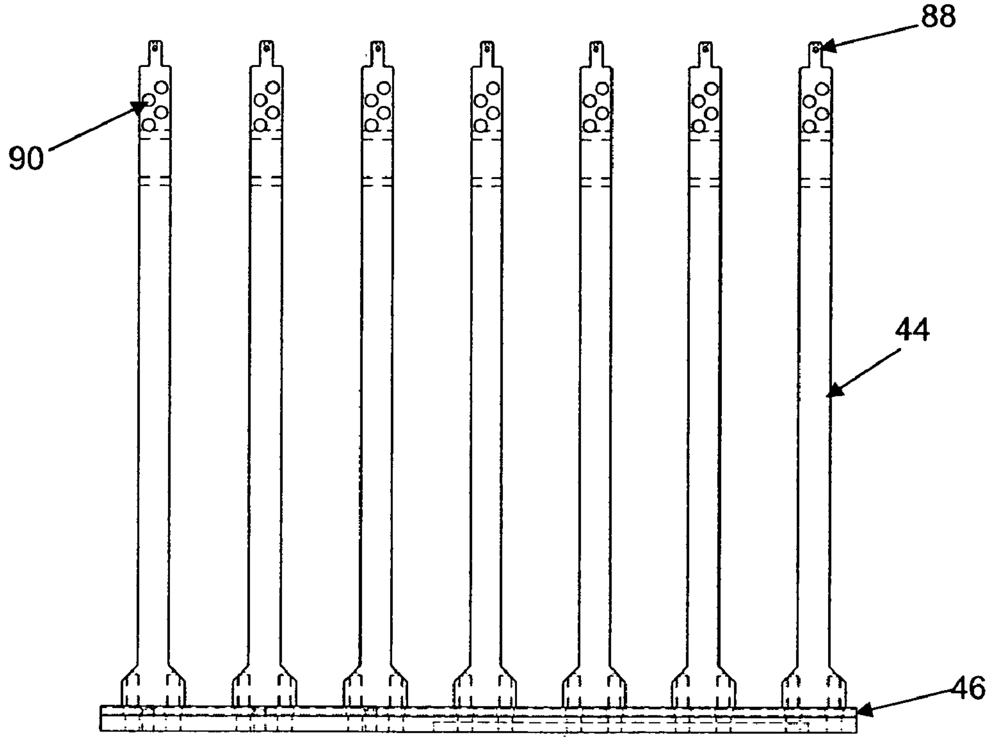
FIG. 6 is a side view of the substrate support assembly looking from direction C of FIG. 5.

FIG. 6 is a side view of the substrate support assembly looking from direction C of FIG. 5. It shows a plurality of support rods 44 mounted on the support base 46. At the uppermost tip of each support rod 44, there is a support wire mounting hole 88 for mounting a support wire 86. The support wire 86 mounted on a support rod 44 is stretched and mounted to an opposite support rod 44 as shown in FIG. 5. There are a plurality of insulation holes 90 formed in each support rod 44 so as to reduce heat transfer through the support rod 44 to the support base 46. These insulation holes 90 may be unfilled or filled with insulation material.

The upper heating assembly 12 is the major heating source for the substrate. The lower heating assembly 14 may in one implementation be configured for use as a constant temperature block, and its temperature is preferably lower than that of the upper heating assembly 12. In the preferred embodiment, the lower heating assembly 14 is adapted to provide temperature control offering substrate heating and/or cooling by delivering heat to or extracting heat from the substrate. This can be done by thermal conduction, for example, by utilizing the cooling plate 36 mounted on the lower heating assembly 14.

Accordingly, it would be appreciated that in this preferred embodiment, the region around the upper heating assembly 12 is set higher than the temperature around the lower heating assembly 14, and both heating means and cooling means are comprised in the lower heating assembly to maintain, increase or decrease the temperature of the cooling plate 36 and/or the lower region of the heating chamber 16 relatively quickly as necessary.

The heating chamber 16 is arranged such that the upper heating assembly 12 is operative to create different isotherms in the heating chamber 16 that are located at different distances from the upper heating assembly 12. Consequently, a number of isotherms are established in the heating chamber, although it essentially comprises only one heating zone. Different isotherms have different isotherm values. Therefore, the substrate can be heated at different temperatures by positioning it at different isotherm positions.

A heating profile is created primarily by adjusting the relative distance between the upper heating assembly 12 and the substrate. Less importantly, the heating profile can be created by adjusting the relative distance between the lower heating assembly 14 and the substrate. The upper heating assembly 12 provides a convection and radiation heat to the substrate. Since the amount of heat transferred to the substrate changes with the separation distance between the substrate and the upper heating assembly 12, the larger the separation distance, the lower the amount of heat transferred to the substrate.

The curing oven 10 should have an adequate zone depth in order to provide sufficient temperature variation in the heating chamber 16 to heat a substrate according to the specified heating profile. The substrate support assembly should have minimal thermal mass to elevate or lower the substrate to specified positions in the heating chamber 16 so as to locate the desired isotherm at particular times during the curing process without contributing to its temperature. Depending on the required heating profile, the substrate support assembly is programmable to position the substrate at particular distances from the upper heating assembly 12 for specified durations.

In use, the system should be aware of the heating temperatures at different distances from the upper heating assembly 12 in order to accurately control heating of the substrate according to the required heating profile. The preferred method for doing this is to pre-calibrate the curing oven 10 to obtain a graph representing the temperatures at different separation distances from the upper heating assembly 12 in the heating chamber 16, based upon predetermined temperatures of the upper and lower heating assemblies 12, 14 and predetermined nitrogen gas flow rates. During heating, the substrate can be positioned for heating at different temperatures by referring to the said graph produced during calibration. Furthermore, it is preferred that a temperature sensor (not shown) is mounted to the substrate support assembly adjacent to the substrate position at the same or similar distance from the upper heating assembly 12 as the substrate for determining in real time the temperature to which the substrate is exposed. This allows for more accurate online determination of the heating temperature.

Figure 7:
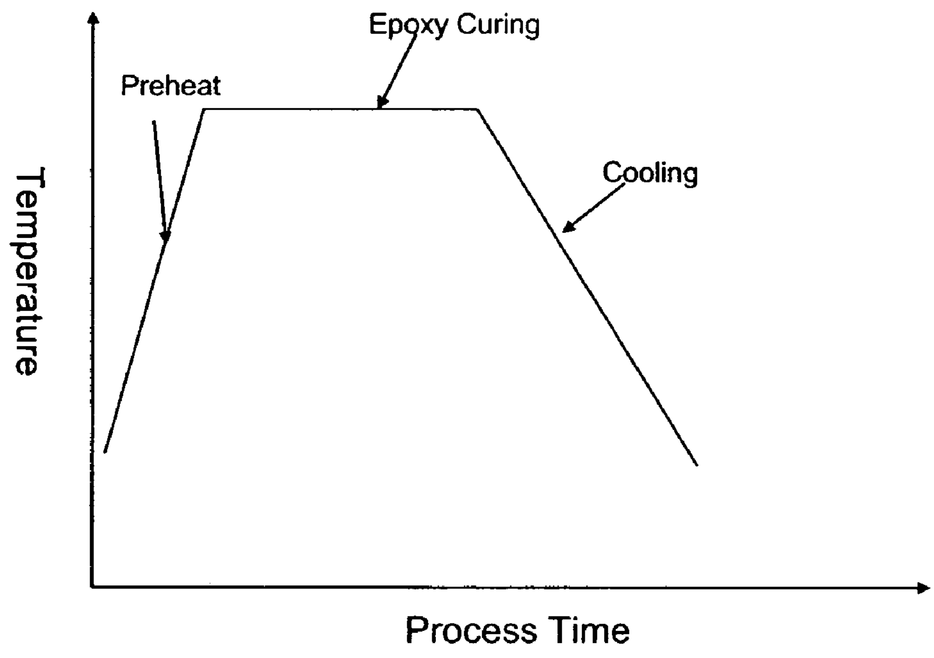
FIG. 7 (Prior Art)
FIG. 7 illustrates typical heating profiles for epoxy curing and reflowing processes.
Figure 7:
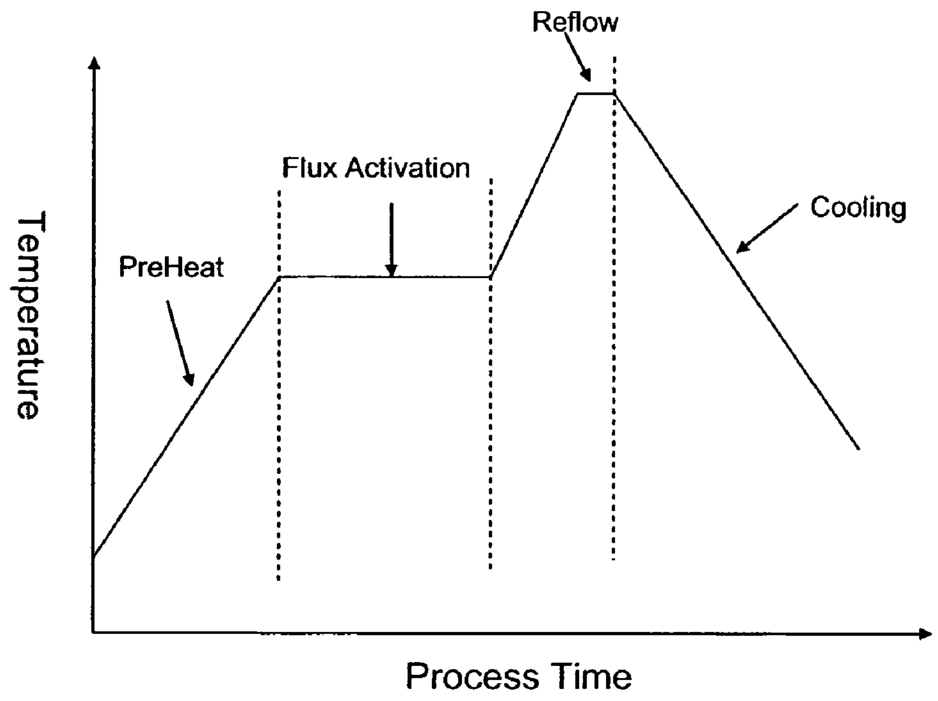
FIG. 7 (Prior Art)

In the preferred embodiment of the invention described above, the curing oven 10 therefore comprises a primary temperature-controlled heating assembly 12 at the top as well as a temperature-controlled heating assembly 14 at the bottom. With the specified temperature controls on both upper and lower heating assemblies and the ability to provide independent time intervals at each portion of the heating profile, various heating profiles such that those shown in FIG. 7 can be achieved. Since the curing oven is able to provide an arbitrary heating profile, the oven is capable of use for other heating processes, such as for solder reflow. It should be appreciated that the curing oven 10 can also function without the temperature-controlled heating assembly 14 at the bottom. Nevertheless, the advantage of having the lower heating assembly 14 is to stabilize the temperature environment inside the chamber to provide a robust heating process. It also provides the flexibility in using thermal conduction heating and cooling processes in addition to the top heating source.

It should also be appreciated that other orientations of the heating sources are possible, such as locating the primary heating assembly at the bottom of the curing oven 10 instead of at the top. Further, with a suitable transportation mechanism, it is also feasible to put the temperature-controlled heating assembly at the side of the heating chamber 16 and control the temperature at which the substrate is heated by changing its relative distance to the heating assembly. It may also be possible to move a temperature-controlled heating source instead of moving the substrate by keeping the substrate stationary, or to move both relative to each other.

An advantage of the preferred embodiment of the current invention is that it employs a single-zone concept in which the heating profile for a substrate is created inside a single thermal zone. Therefore, the size and construction complexity of the curing oven can be substantially reduced. This is especially beneficial for small-scale production facilities and where there are space constraints that prevent the installation of conventional multiple-zone curing ovens.

Moreover, as the oven size is relatively small, sealing becomes easier and therefore, the consumption of nitrogen or forming gas to maintain a low level of oxygen content to prevent oxidation is correspondingly lower. The single zone concept also eliminates the need for zonal interaction and the instability that this might cause. A more thermally stably environment is thereby provided for the substrate in the curing process.

Furthermore, unlike multiple-zone ovens that have differences of separation distances between the substrate and heating devices in different zones that may result in inconsistent heating, the curing oven according to the preferred embodiment of the invention is capable of providing a continuously consistent temperature range and zone depth since the distance of the substrate to the heating device is controllable.

The invention described herein is susceptible to variations, modifications and/or additions other than those specifically described and it is to be understood that the invention includes all such variations, modifications and/or additions which fall within the spirit and scope of the above description.

The invention claimed is:

1. An oven for curing or reflowing compounds on objects, comprising:

a heating chamber for containing at least one of the objects;

a first heating assembly mounted in thermal communication with the heating chamber to provide heat thereto, the first heating assembly comprising a gas discharge outlet having gas discharge holes discharging a relatively inert gas into the heating chamber, the first heating assembly comprising a gas inlet having gas channels formed in the first heating assembly, the gas channels being in communication with gas discharge holes of the gas discharge outlet, and the first heating assembly comprising an exhaust system to remove the relatively inert gas from the heating chamber;

a second heating assembly mounted in thermal communication with the heating chamber to provide heat thereto, the second heating assembly being spaced from the first heating assembly; and a support assembly for supporting an object in the heating chamber for heating; wherein the support assembly is movable relative to the first heating assembly and the second heating assembly for controllably positioning the object supported by the support assembly at variable distances with respect to the first heating assembly and the second heating assembly for providing controlled heating of the object at different temperatures which occur in the chamber at different distances with respect to the first and second heating assemblies, and wherein the object is movable along a path between the first and second heating assemblies for establishing controlled heating of the object.

2. The oven according to claim 1, wherein the first heating assembly is operative to create different isotherms located at different distances from the first heating assembly in the heating chamber.

3. The oven according to claim 1, wherein the first heating assembly is mounted to an inside surface of the heating chamber.

4. The oven according to claim 1, further comprising insulation walls to substantially enclose sides of the heating chamber.

5. The oven according to claim 1, wherein the support assembly is drivable to move the object with respect to the first heating assembly.

6. The oven according to claim 5, wherein the support assembly comprises support rods carrying a support platform for supporting the object, the support rods being mounted to a drivable support base spaced from the support platform.

7. The oven according to claim 6, wherein the support platform is located inside the heating chamber, the support base is located outside the heating chamber and the support rods extend from the support base into the heating chamber through an enclosure of the heating chamber.

8. The oven according to claim 7, wherein the support platform comprises support wires mounted onto the ends of the support rods.

9. The oven according to claim 1, wherein the first and second heating assemblies are mounted facing each other and the object is positioned such that the first and second heating assemblies are located at opposite sides of the object.

10. The oven according to claim 1, wherein the second heating assembly is operable to be maintained at a constant temperature.

11. The oven according to claim 1, wherein the second heating assembly is maintained at a lower temperature than the first heating assembly.

12. The oven according to claim 1, wherein the second heating assembly comprises both a heating device and cooling device coupled to it.

13. The oven according to claim 12, wherein the cooling device comprises a device operable for introducing compressed air into the second heating assembly.

14. The oven according to claim 13, including a network of compressed gas channels formed in the second heating assembly for distributing compressed air in the second heating assembly.

15. The oven according to claim 14, further comprising a conduction plate mounted on the second heating assembly, the conduction plate being in thermal communication with the heating and cooling devices, and the conduction plate being operable to conduct heat to or away from the object when the object is placed in proximity to the conduction plate.

* * * * *